(12) United States Patent
Xia et al.

(10) Patent No.: US 7,304,845 B2
(45) Date of Patent: Dec. 4, 2007

(54) HEAT SINK ASSEMBLY

(75) Inventors: Wan-Lin Xia, Shenzhen (CN); Tao Li, Shenzhen (CN); Yong Zhong, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/265,344

(22) Filed: Nov. 2, 2005

(65) Prior Publication Data

US 2007/0097631 A1    May 3, 2007

(51) Int. Cl.
   *H05K 7/20* (2006.01)
(52) U.S. Cl. .................. 361/697; 361/690; 361/695; 361/702; 361/703; 174/15.1; 174/16.1; 174/16.3
(58) Field of Classification Search ................ 361/688, 361/690, 694, 695, 697, 702, 703; 257/706, 257/722; 174/16.1, 16.3, 15.1; 439/487; 165/80.3
See application file for complete search history.

(56) References Cited

U.S. PATENT DOCUMENTS

| | | | |
|---|---|---|---|
| 5,630,469 A * | 5/1997 | Butterbaugh et al. ...... | 165/80.3 |
| 6,304,445 B1 * | 10/2001 | Bollesen ...................... | 361/697 |
| 6,392,885 B1 * | 5/2002 | Lee et al. .................... | 361/697 |
| 6,396,697 B1 * | 5/2002 | Chen .......................... | 361/704 |
| 6,520,250 B2 * | 2/2003 | Lee et al. .................... | 165/121 |
| 6,672,374 B1 * | 1/2004 | Lin ............................. | 165/121 |
| 7,021,368 B2 * | 4/2006 | Lin et al. ............... | 165/104.33 |
| 7,044,204 B2 * | 5/2006 | Chen et al. ................. | 165/122 |
| 2002/0075654 A1 * | 6/2002 | Chen .......................... | 361/709 |
| 2003/0210526 A1 | 11/2003 | Huang et al. | |
| 2003/0227749 A1 | 12/2003 | Li | |
| 2004/0066624 A1 * | 4/2004 | Lee et al. .................... | 361/697 |
| 2005/0098304 A1 * | 5/2005 | Lin et al. ............... | 165/104.33 |
| 2006/0137861 A1 * | 6/2006 | Wang et al. ........... | 165/104.33 |

* cited by examiner

*Primary Examiner*—Lisa Lea-Edmonds
*Assistant Examiner*—Anthony M Haughton
(74) *Attorney, Agent, or Firm*—Morris Manning Martin LLP; Tim Tingkang Xia, Esq.

(57) ABSTRACT

A heat sink assembly includes a heat sink (10), a fan holder (20) mounted on the heat sink and a fan (30) carried by the fan holder. The heat sink defines a slot (148) in a top thereof. The fan holder comprises flap (260) downwardly extending to engage in the slot, and a fastening lug (28) secured to a recessed portion (122) of a top surface of a base (12) of the heat sink. The fastening lug extending from a baffle (24) which fittingly engages with a raised portion (124) of the top surface of the base adjacent to the recessed portion.

6 Claims, 7 Drawing Sheets

HEAT SINK ASSEMBLY

BACKGROUND

1. Field

The present invention relates to a heat sink assembly, and more particularly to a heat sink assembly which has a fan holder with a fan and a heat sink.

2. Related Art

Electronic components such as central processing units (CPUs) frequently generate large amounts of heat during normal operation. Such heat can adversely affect the operational stability of the electronic components, therefore a heat sink is used to dissipate heat generated by the electronic component. A fan is often attached to the heat sink to provide forced air convection to the heat sink.

At present, a conventional heat dissipation device comprises a heat sink and a fan defining four through holes in four corners thereof. The heat sink comprises a base and a plurality of parallel fins extending upwardly from the base. A plurality of screws threads is formed in two outmost fins at each side of the heat sink. Four screws are received through the through holes and engaged in the screw threads. The structure can mount the fan to the heat sink, but a problem is that it is complex to install when mounting the fan to the heat sink all by threads. Operation between the fan and the heat sink is difficult and efficiency is also poor.

SUMMARY

What is needed is a heat sink assembly which has a fan holder with a fan mounted thereon and a heat sink. The fan holder is easily fastened to the heat sink to mount the fan on the heat sink.

A heat sink assembly in accordance with a preferred embodiment of the present invention comprises a heat sink, a fan holder mounted on the heat sink and a fan carried by the fan holder. The heat sink defines at least one slot at one side thereof, and the fan holder comprises a first position portion engaging within the at least one slot and a second position portion screwed to another side of the heat sink.

Other advantages and novel features will become more apparent from the following detailed description when taken in conjunction with the accompanying drawings, in which:

DETAILED DESCRIPTION OF THE INVENTION

Reference will now be made to the drawings to describe the present invention in detail.

Figure 1:
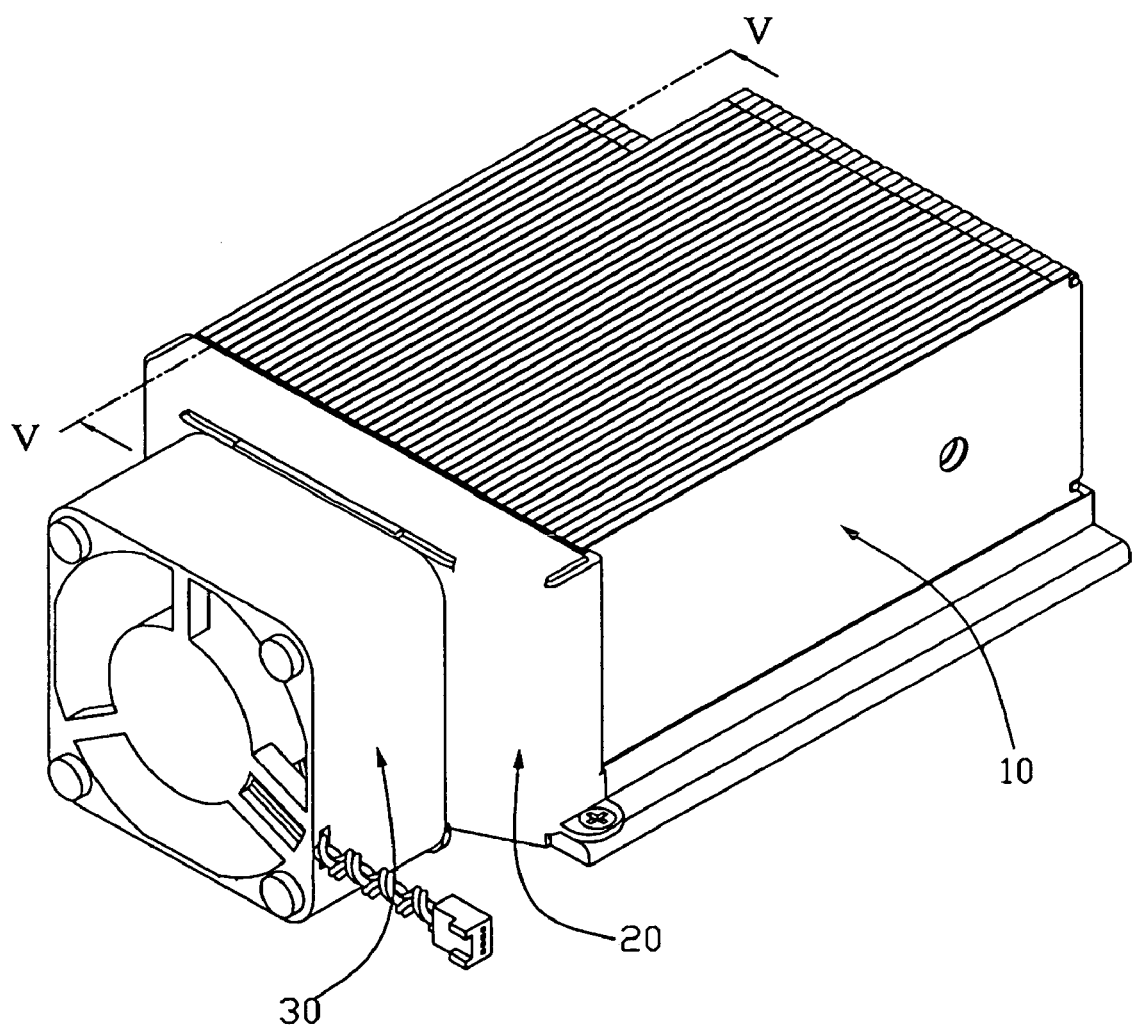
FIG. 1 is an assembled view of a heat sink assembly in accordance with a preferred embodiment of the present invention, comprising a heat sink and a fan holder carrying a fan.

FIGS. 1 illustrates a heat sink assembly in accordance with a preferred embodiment of the present invention. The heat sink assembly comprises a heat sink 10, a fan holder 20 mounted on a front end of the heat sink 10 and carrying a fan 30 on a front end of the fan holder 20.

Figure 2:
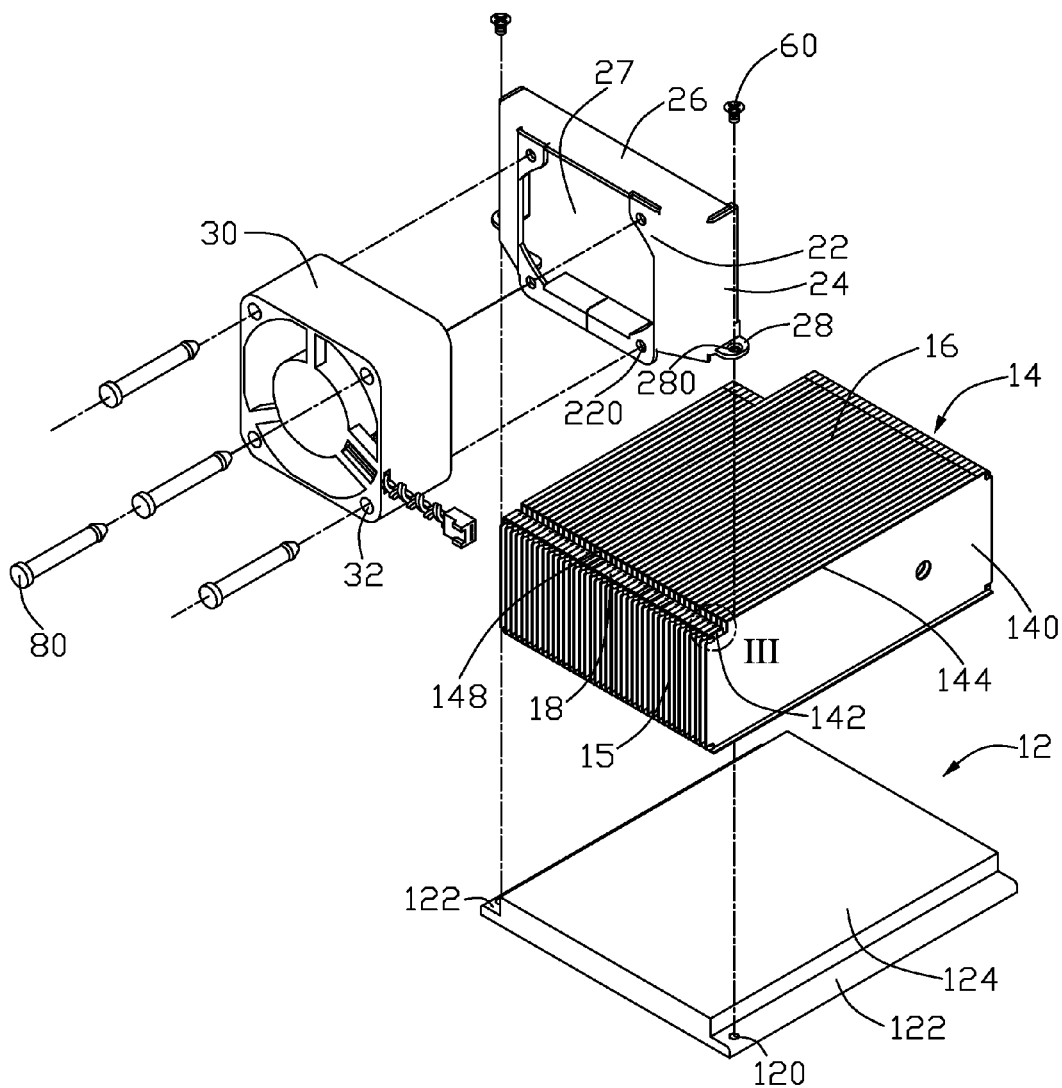
FIG. 2 is an exploded view of FIG. 1.
Figure 3:
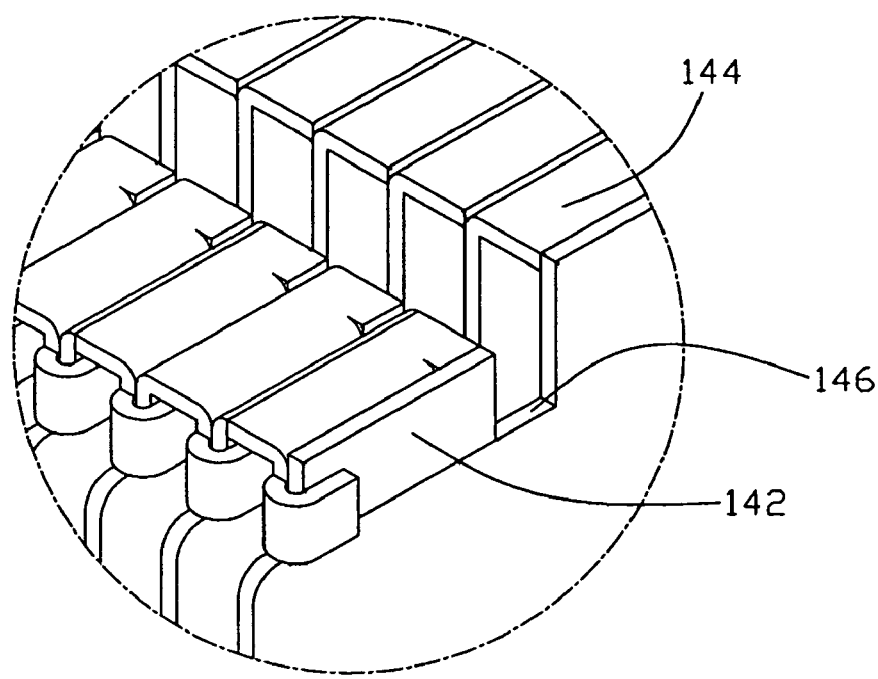
FIG. 3 is an enlarged view of an indicated portion III in FIG. 2.
Figure 5:
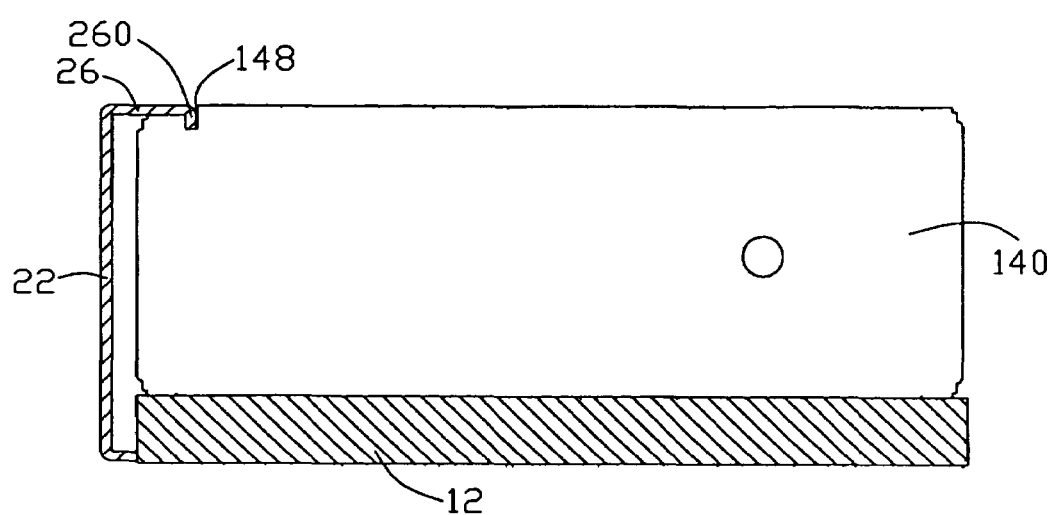
FIG. 5 is a cross-sectional view of the heat sink assembly taken along line V-V in FIG. 1.

Preferring to FIG. 2, the heat sink 10 comprises a heat receiver such as a base 12 and a heat dissipation fins group 14 attached on the base 12. The base 12 defines, near a front end thereof, a pair of screw holes 120 at a pair of opposite sides of an upper surface (not labeled) thereof, respectively. The upper surface (not labeled) of the base 12 has two recessed portions 122 at the opposite sides and a raised portion 124 between the two recessed portions 122. The screw holes 120 are defined in the recessed portions 122, respectively. The base 12 has a lower surface opposite the upper surface. The lower surface is used for thermally engaging with a heat-generating electronic device (not shown) such as a CPU (central processing unit). The heat dissipation fins group 14 consists of a plurality of spaced heat dissipation fins 140 and a plurality of channels 15 each extending between two adjacent heat dissipation fins 140. Each heat dissipation fin 140, near the fan holder 20, comprises a hook 142 and a flange 144 behind the hook 142. The hook 142 and the flange 144 are formed at an upper side of the heat dissipation fins 140 (clearly seen in FIG. 3). The hooks 142 cooperatively form a first plane 16, and the flanges 144 cooperatively form a second plane 18 on the top side of the heat dissipation fins group 14. A cutout 146 (shown in FIG. 3) is defined between the hook 142 and the flange 144 of each heat dissipation fin 140. The cutouts 146 cooperatively define a slot 148 between the first and second planes 16, 18 (clearly seen in FIGS. 2 and 5).

Figure 4:
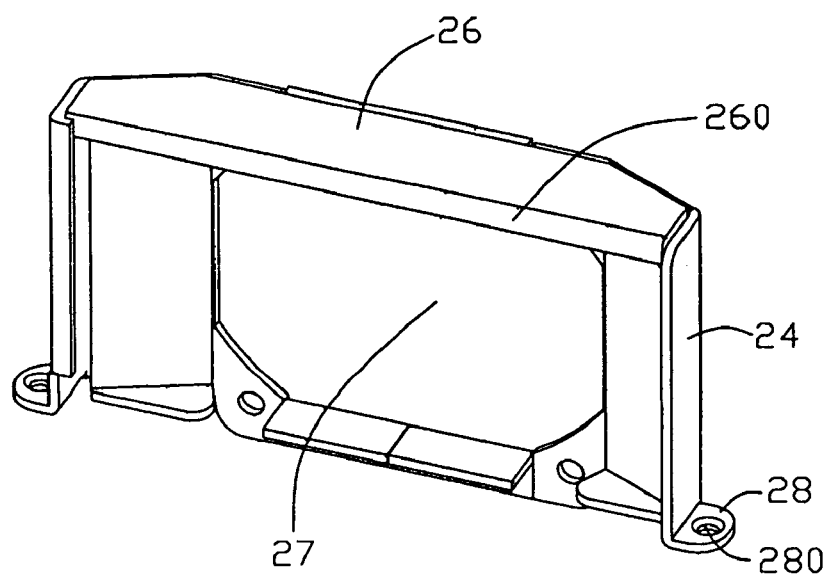
FIG. 4 is a view of the fan holder of FIG. 1, but viewed from a different aspect.

Referring to FIGS. 2 and 4, the fan holder 20 comprises a body 22, and three walls extending rearwards from the body 22, namely a pair of baffles 24 extending rearwards from a pair of opposite lateral sides of the body 22, and a top cover 26 extending rearwards from a top of the body 22. The baffles 24 are spaced from each other a distance, which is slightly larger than a width of the raised portion 124 of the base 12. The body 22 defines an opening 27 in a middle thereof and four screw holes 220 near four corners of the opening 27. A pair of fastening lugs 28 extends from bottoms of the baffles 24 toward opposite lateral directions, respectively. Each fastening lug 28 extends perpendicularly outwardly from each baffle 24 and is located corresponding to a respective screw hole 120 of the base 12. Each fastening lug 28 defines a hole 280 therein in alignment with a corresponding screw hole 120 when the fan holder 20 is assembled to the base 12, in which the baffles 24 fittingly sandwiches the raised portion 124 of the base 12 and the fins group 14 is mounted on the raised portion 124 of the base 12. Two screws 60 are used to extend through the holes 280 and screw into the screw holes 120 to thereby fasten the fan holder 20 to the base 12. The top cover 26 forms a flap 260 at a rear free end thereof for inserting into the slot 148. The flap 260 is received in the slot 148 in the top of the heat dissipation fins group 14, whereby the fan holder 20 is mounted on the front end of the heat sink 10 (also refer to FIG. 5).

The fan 30 defines four holes 32 at four corners thereof corresponding to the screw holes 220. Four screws 80 are used to extend through the four holes 32 and screw into the screw holes 220, thereby fastening the fan 30 to the fan holder 20. The fan 30 faces to the opening 27 so that a forced airflow generated by the fan 30 enters the channels 15 of the fins group 14 through the opening 27 of the fan holder 20.

Figure 6:
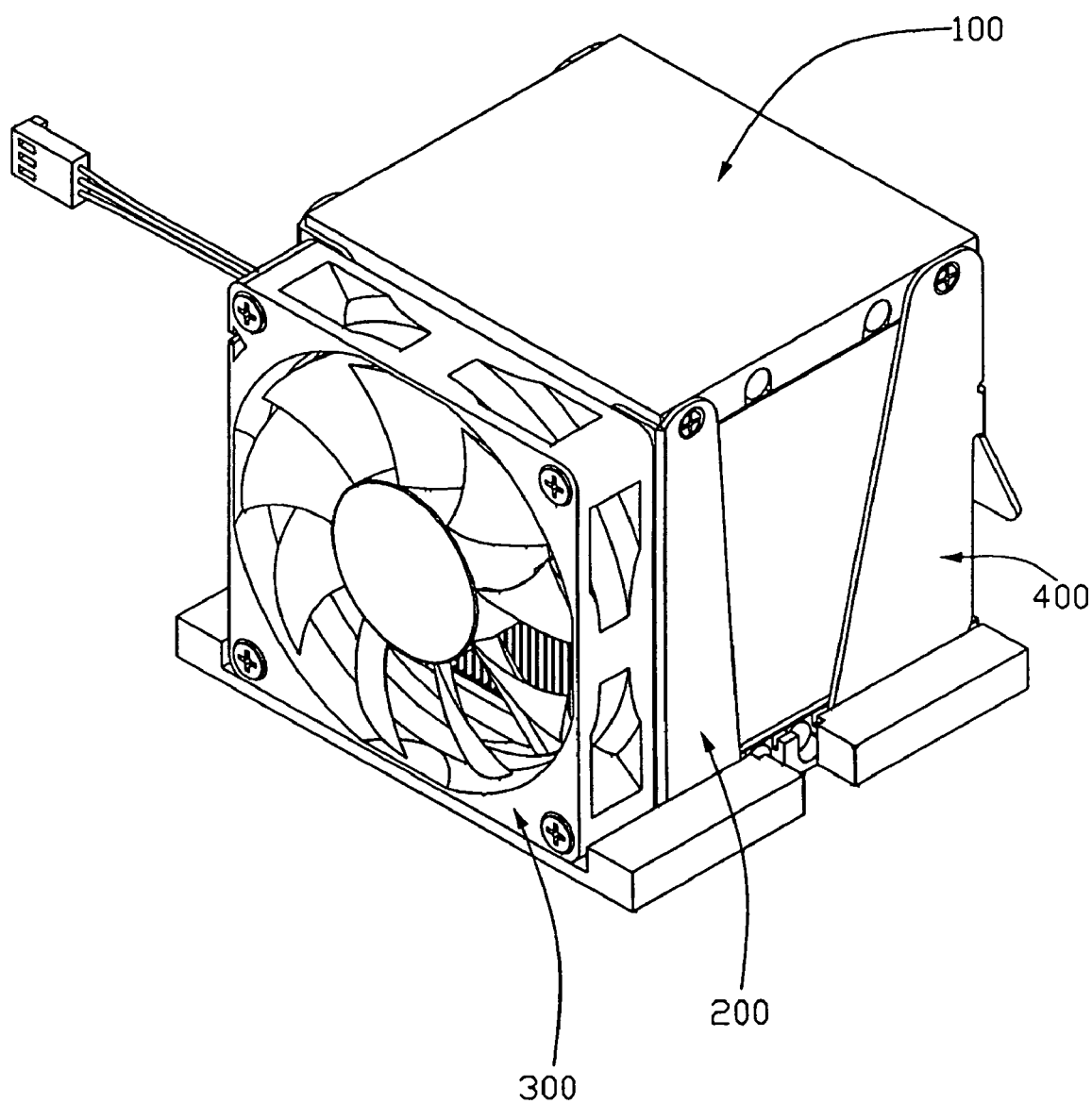
FIG. 6 is an assembled view of a heat sink assembly in accordance with another embodiment of the present invention, comprising a heat sink and a fan holder carrying a fan, the heat sink comprising a base.
Figure 7:
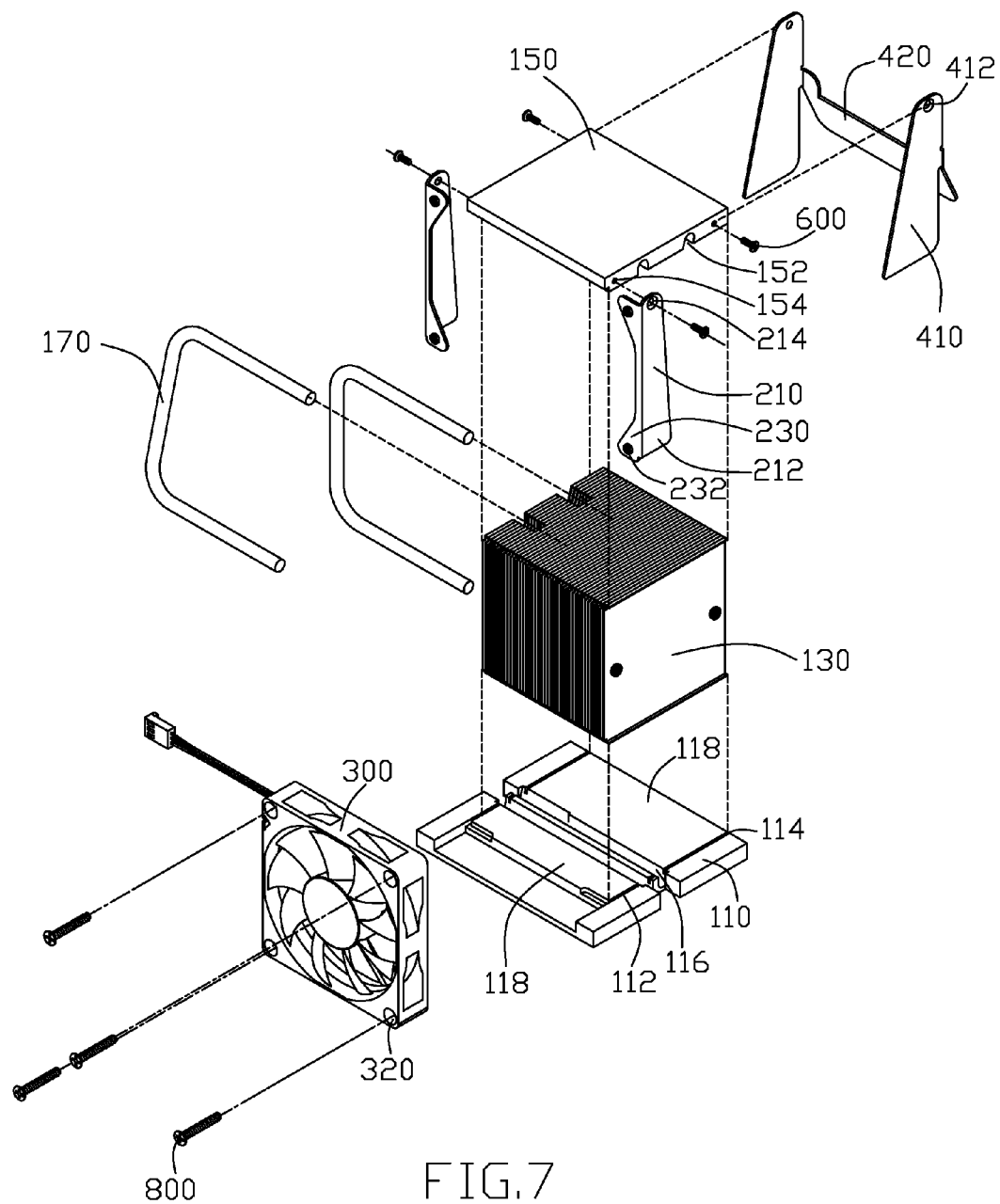
FIG. 7 is an exploded view of FIG. 6.
Figure 8:
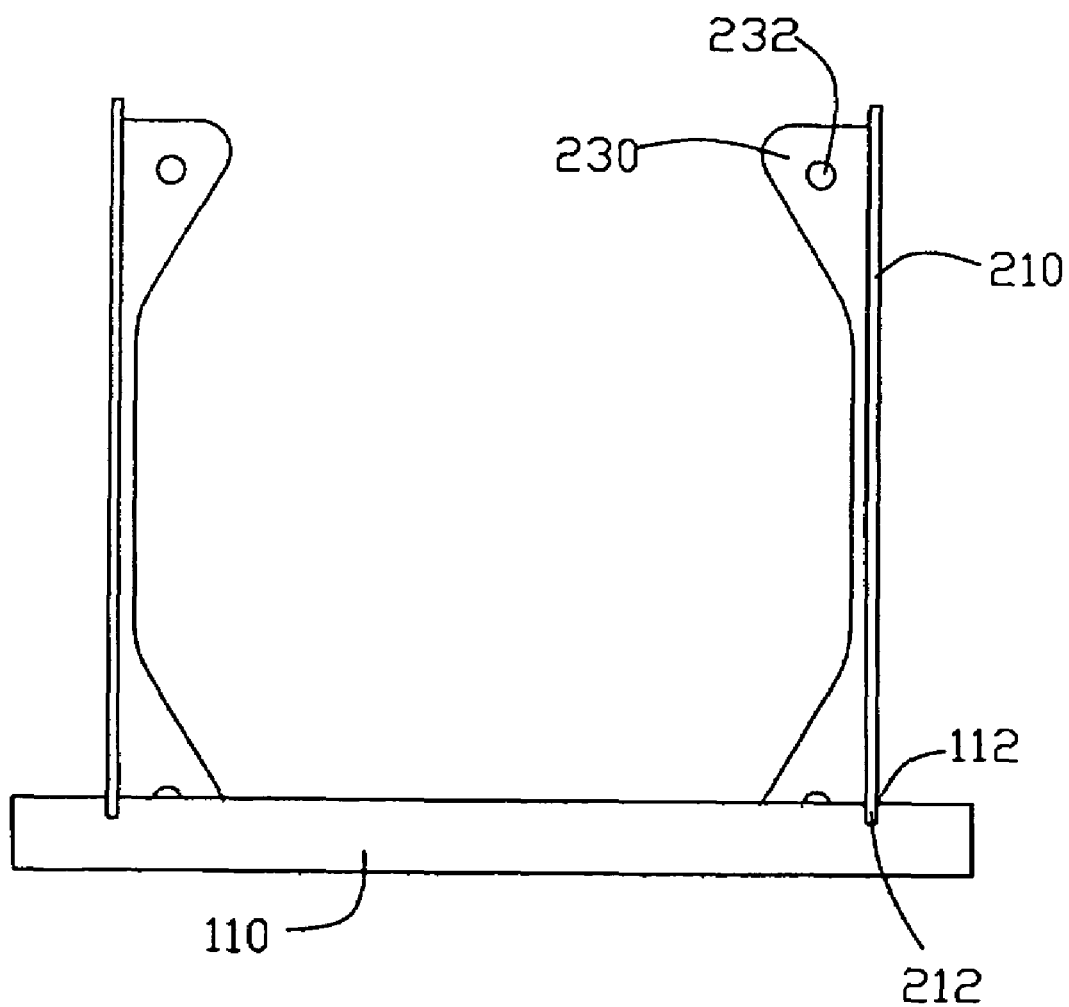
FIG. 8 is a front elevational view of the fan holder engaging with the base of FIG. 7.

Referring to FIGS. 6-8, a heat sink assembly is shown in accordance with another embodiment of the present invention. The heat sink assembly comprises a heat sink 100, a fan holder 200 mounted on a front end of the heat sink 100, a fan 300 mounted on a front end of the fan holder 200 and an airflow guider 400 mounted on a rear end of the heat sink 100. The heat sink 100 comprises a base 110, a plurality of fins 130 extending from the base 110, a cover 150 and a pair of heat pipes 170 attached to the heat sink 100. The cover 150 is mounted on a top of the fins 130. The base 110 respectively defines a first pair and second pair of slots 112, 114 in a pair of opposite lateral sides of a top surface (not labeled) of the base 110. The slots 112 are located in front of the slots 114. The base 110 has a bottom surface (not labeled) opposite the top surface. The bottom surface is used for thermally engaging with a heat-generating electronic device (not shown), such as a CPU (central processing unit). A raised portion 118 is thus formed on the top surface of the base 12 between the slots 112, 114. The first and second slots 112, 114 are used to respectively engage with the fan holder 200 and the airflow guider 400. The first slots 112 are shorter than the second slots 114. The base 110 further defines a pair of grooves 116 in the top surface between the slots 112, 114 for accommodating evaporators (not labeled) of the heat pipes 170. The grooves 160 are extended perpendicular to the slots 112, 114. The cover 150 defines a pair of flutes 152 accommodating condensers (not labeled) of the heat pipes 170 in a bottom of the cover 150. A pair of screw holes 154 is defined in front ends of lateral sides of the cover 150, respectively. A second pair of screw holes 154 is defined in rear ends thereof, respectively.

The fan holder 200 comprises a pair of brackets (not labeled) each having a body 210 and a pair of support arms 230 perpendicularly extending from top and bottom ends of a front edge of the body 210. The body 210 defines a mounting hole 214 at an upper end thereof. Each support arm 230 defines a screw hole 232 therein. The body 210 further has a mounting foot 212 at a lower end thereof. The airflow guider 400 comprises a pair of mounting pieces 410 and a guiding plate 420 interconnecting the mounting pieces 410. Each mounting piece 410 defines a position hole 412 at an upper end thereof. The mounting foot 212 of the body 210 of each bracket is inserted in a corresponding first slot 112 and a bottom of each mounting piece 410 is inserted in a corresponding second slot 114, so that bottoms of the fan holder 200 and the airflow guider 400 are respectively mounted on the two lateral sides of the base 110, wherein a bottom edge of the foot 212 fittingly engaging with the upper surface of the base 110 in the slot 112 and a side face of the foot 212 fittingly engaging with a lateral side of the raised portion 118. Four screws 600 are used to respectively extend through the mounting holes 214, the position holes 412 and screw into the screw holes 154, thereby fastening tops of the fan holder 200 and the airflow guider 400 to the cover 150 of the heat sink 100.

The airflow guider 400 is used to guide an airflow from the fan 300 through the heat sink 100 to flow downward and rearwards, so that a second heat-generating electrical device located near a rear of the heat sink 100 can also be cooled by the airflow generated by the fan 300.

The fan 300 defines four holes 320 at four corners thereof corresponding to the screw holes 232. Four screws 800 are used to extend through the four holes 320 and screw into the screw holes 232, thereby fastening the fan 300 to the fan holder 200.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat sink assembly comprising:
   a heat sink defining at least one slot in a side thereof;
   a fan holder mounted to a front end of the heat sink and comprising a first position portion engaging within the at least one slot, and a second position portion screwed to another side of the heat sink;
   a fan secured to the fan holder; and
   an airflow guider mounting on a rear end of the heat sink, the airflow guider comprising a guiding plate and guiding an airflow generated by the fan and through the heat sink to flow downwards and rearwards;
   wherein the heat sink comprises a base and wherein the at least one slot is defined in the base, the first position portion being inserted in the at least one slot; and
   wherein the base further defines a pair of second slots in the pair of opposite lateral sides thereof, the airflow guider being inserted in the second slots.

2. The heat sink assembly as claimed in claim 1, wherein the at least one slot comprises a pair of first slots, the first slots being defined in a pair of opposite sides of the base.

3. The heat sink assembly as claimed in claim 2, wherein the fan holder comprises a pair of mounting brackets, a bottom of each bracket being inserted in a corresponding first slot in the base.

4. The heat sink assembly as claimed in claim 3, wherein the heat sink further comprises a cover opposite to the base and the cover defines a pair of screw holes in a pair of opposite lateral sides of the cover, a top end of each bracket defining a hole therein and the top end of each bracket being screwed on a corresponding lateral side of the cover by extending a screw through the top end and screwing into a corresponding screw hole.

5. The heat sink assembly as claimed in claim 3, wherein each mounting bracket comprises a pair of support arms at a pair of opposite ends, the support arms securing the fan on the fan holder.

6. A heat sink assembly comprising:
   a base having a bottom surface for thermally engaging with a heat-generating electronic device and a top surface opposite the bottom surface, the top surface having a raised portion and a lower portion;
   a fins group mounted on the raised portion of the top surface of the base and defining a plurality of channels therein;
   a fan holder having a mounting portion fittingly engaging with the raised portion and the lower portion of the base; and
   a fan mounted on the fan holder, an airflow generated by the fan flowing into the channels of the fins group;
   wherein the mounting portion of the fan holder includes a baffle on a lateral side of the fan holder and a fastening lug extending outwardly from the baffle, the baffle fittingly engaging with the raised portion and the fastening lug is secured to the lower portion; and
   wherein the fins group has a slot in a top thereof, and fan holder has a downwardly extending flap fittingly engaging in the slot.

* * * * *